United States Patent

Hirayama

[11] Patent Number: 6,100,768
[45] Date of Patent: Aug. 8, 2000

[54] RING OSCILLATOR GENERATING PULSE SIGNAL AT CONSTANT PULSE PERIOD UNDER UNSTABLE POWER VOLTAGE

[75] Inventor: Takao Hirayama, Tokyo, Japan

[73] Assignee: NEC Corporation, Tokyo, Japan

[21] Appl. No.: 09/120,737

[22] Filed: Jul. 23, 1998

[30] Foreign Application Priority Data

Jul. 25, 1997 [JP] Japan ..................................... 9/215927

[51] Int. Cl.⁷ .............................. H03B 5/24; H03B 5/04; H03K 3/011
[52] U.S. Cl. ............................ 331/57; 331/175; 331/185; 331/186
[58] Field of Search .............................. 331/57, 175, 176, 331/185, 186

[56] References Cited

U.S. PATENT DOCUMENTS 5,250,914  10/1993  Kondo ........................................ 331/111

FOREIGN PATENT DOCUMENTS 4-259986  9/1992  Japan .

*Primary Examiner*—David Mis
*Attorney, Agent, or Firm*—Sughrue, Mion, Zinn, Macpeak & Seas, PLLC

[57] ABSTRACT

A ring oscillator has first inverters and second inverters connected in such a manner as to form a loop; the first inverters are powered through a current controller controlling the first inverters in such a manner as to decelerate the logical operation when the power voltage is increased in magnitude; the second inverters are directly powered with the power voltages so that each second inverter accelerates the logical operation when the power voltage is increased in magnitude; and the second inverters cancel the increment of the pulse period introduced by the first inverters due to increase of the power voltage for keeping the pulse period constant.

11 Claims, 9 Drawing Sheets

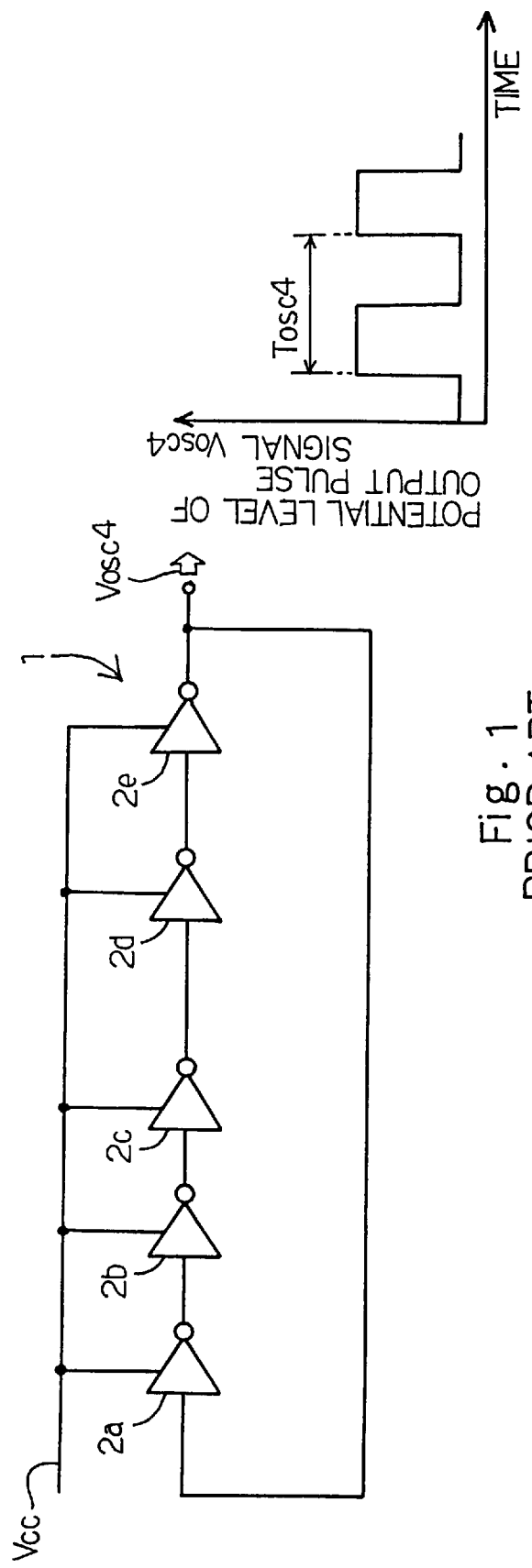

RING OSCILLATOR GENERATING PULSE SIGNAL AT CONSTANT PULSE PERIOD UNDER UNSTABLE POWER VOLTAGE

FIELD OF THE INVENTION

This invention relates to a ring oscillator and, more particularly, to a ring oscillator operative to generate an output pulse signal at constant pulse period under unstable power voltage.

DESCRIPTION OF THE RELATED ART

A semiconductor dynamic random access memory device does not require an external clock signal. An internal clock generator is incorporated in the semiconductor dynamic random access memory device, and defines refresh intervals. Data bits stored in the memory cells are refreshed at the refresh intervals, and the refreshing operation causes the memory cells to keep the data bits against the leakage current from the memory cells. The refresh intervals may be constant regardless of the power voltage and the environment temperature. However, it is preferable to change the refresh intervals depending upon the data retention capability of the memory cells. For example, if the power voltage is high, the dynamic random access memory cell can store a data bit for long time, and a long refresh interval is preferable. On the other hand, if the power voltage is low, the dynamic random access memory cell is liable to lose the data bit, and requires the refreshing operation at short intervals.

A semiconductor self-refreshable dynamic random access memory device has a ring oscillator for defining the refreshing intervals. The ring oscillator is implemented by odd inverters. The inverters are connected in such a manner as to form a signal loop, and the inverters are powered with an external power voltage Vcc. The ring oscillator oscillates at a predetermined frequency, and supplies an output pulse signal to a counter. When the counter reaches a predetermined value, a refresh controller starts the refreshing operation.

FIG. 1 illustrates the prior art ring oscillator 1, which consists of five inverters 2a, 2b, 2c, 2d and 2e. The inverters 2a to 2e are connected in series, and the output node of the last inverter 2e is connected to the input node of the first inverter 2a. Power voltage Vcc is supplied to the inverters 2a to 2e, and an output pulse signal Vosc4 is supplied from the output node of the last inverter 2e. The pulse period Tosc4 is defined as shown in FIG. 2. When the power voltage Vcc is increased, the pulse period Tosc4 is decreased as shown in FIG. 3. This tendency is undesirable for the refreshing operation. In detail, when the power voltage Vcc is high, the dynamic random access memory cell stores a data bit for long time, and the high power voltage Vcc allows the refreshing controller to prolong the refreshing intervals. However, the prior art ring oscillator 1 shortens the pulse period Tosc4, and the counter makes the refresh intervals short. On the other hand, when the power voltage Vcc is low, the dynamic random access memory cell loses a data bit within short time, and the refreshing controller has to shorten the refreshing intervals. However, the prior art ring oscillator 1 prolongs the pulse period Tosc4, and the counter makes the refresh intervals long. Thus, the prior art ring oscillator 1 varies the pulse period Tosc4 inversely to the data retention characteristics of the dynamic random access memory cell.

In order to automatically regulate the refreshing intervals under the variation of the power voltage Vcc, another prior art ring oscillator is proposed in Japanese Patent Publication of Unexamined Application No. 4-259986. FIG. 4 illustrates the prior art ring oscillator disclosed in the Japanese Patent Publication of Unexamined Application. The prior art ring oscillator 4 is implemented by a loop of inverters 4a to 4e as similar to the prior art ring oscillator 1, and outputs a pulse signal Vosc2 from the output node of the last inverter 4e. The output pulse signal Vosc2 has the pulse period Tosc2 as shown in FIG. 5. Although the prior art ring oscillator 1 is directly powered with the external power voltage Vcc, the ring oscillator 4 is indirectly powered with a ring-oscillator power voltage Vro, and a power source 5 generates the ring-oscillator power voltage Vro from the external power voltage Vcc. The power source 5 keeps the ring oscillator power voltage Vro constant, or varies the ring oscillator power voltage Vro inversely to the external power voltage Vcc. When power source 5 varies the ring oscillator power voltage Vro inversely proportional to the magnitude of the external power voltage Vcc, the ring oscillator power voltage Vro makes the pulse period Tosc2 proportionally increased together with the magnitude of the external power voltage Vcc as shown in FIG. 6. When the external power voltage Vcc increases the magnitude, the refresh intervals are prolonged. When the external power voltage Vcc decreases the magnitude, the refresh intervals are shortened. Thus, the prior art ring oscillator disclosed in the Japanese Patent Publication of Unexamined Application is appropriate for the dynamic random access memory device.

FIG. 7 illustrates another prior art variable ring oscillator 6. The prior art variable ring oscillator 6 includes inverters 6a/ 6b/ 6c/ 6d/ 6e connected in series, and the output node of the third inverter 6c is connected to the input node of the first inverter 6a. Thus, the first to third inverters 6a/ 6b/ 6c form a signal loop.

The ring oscillator 6 is accompanied with a current controller 7. The current controller 7 includes a series combination of a p-channel enhancement type load transistor Qp1 and a resistor R1 connected between a power voltage line Vcc and a ground line GND and p-channel enhancement type current controlling transistors Qp2 connected in parallel between the power voltage line Vcc and the inverters 6a–6c. The gate electrode of the p-channel enhancement type load transistor Qp1 is connected to the drain node thereof, and is further connected to the gate electrodes of the p-channel enhancement type current controlling transistors Qp2.

The current controller 7 further includes a series combination of a resistor R2 and an n-channel enhancement type load transistor Qn1 connected between the power supply line Vcc and the ground line GND and n-channel enhancement type current controlling transistors Qn2 connected between the inverters 6a–6c and the ground line GND. The gate electrode of the n-channel enhancement type load transistor Qn1 is connected to the drain node thereof, and is further connected to the gate electrodes of the n-channel enhancement type current controlling transistors Qn2. Thus, all of the inverters 6a–6c forming the signal loop are controlled by the current controller 7.

The p-channel enhancement type load transistor Qp1 controls the amount of current supplied to all the inverters 6a–6c, and n-channel enhancement type load transistor Qn1 controls the amount of current discharged from all the inverters 6a–6c. When the external power voltage Vcc becomes higher than usual, the p-channel enhancement type load transistor Qp1 lifts the potential level at the gate electrodes of the p-channel enhancement type current controlling transistors Qp2, and the p-channel enhancement type current controlling transistors Qp2 are restricted by the p-channel enhancement type load transistor Qp1. As a result, the increment of current passing through each inverter 6a/ 6b/ 6c is not so much that the inverters 6a–6c can not reach a certain switching velocity corresponding to the external power voltage Vcc.

Similarly, the n-channel enhancement type current controlling transistors Qn2 are controlled by the n-channel enhancement type load transistor Qn1. When the external power voltage Vcc becomes higher than usual, the amount of current discharged from each of the inverters 6a–6c is increased. However, the n-channel enhancement type load transistor Qn1 does not allow the n-channel enhancement type current controlling transistors Qn2 to increase the discharging current to certain value corresponding to the external voltage Vcc. As a result, the inverters 6a–6c are decelerated. The inverter 6e generates an output pulse signal Tosc3, and the output pulse signal Tosc3 has the pulse period Tosc3 as shown in FIG. 8.

The present inventor varied the external power voltage Vcc from 1.5 volts to 4 volts, and measured the pulse period Tosc3. The pulse period Tosc3 was increased together with the external power voltage Vcc as shown in FIG. 9.

The output pulse signal Vosc3 is supplied to a counter (not shown), and the counter defines the refresh intervals. When the external power voltage Vcc becomes higher than usual, the dynamic memory cells enhances the data retention capability, and the prior art ring oscillator 6 causes the counter to prolong the refresh intervals. On the other hand, when the external power voltage Vcc becomes lower than usual, the dynamic memory cells degrades the data retention capability, and the prior art ring oscillator 6 causes the counter to shorten the refresh intervals.

A semiconductor dynamic random access memory device is designed to refresh data bits under a step-down power voltage such as 2 volts, and the self-refreshing under 2 volts aims at reduction of power consumption. However, when the semiconductor dynamic random access memory device is equipped with the prior art ring oscillator 6, the semiconductor dynamic random access memory device increases the power consumption. As will be understood from FIG. 9, the pulse period Tosc3 at 2 volts is shorter than the pulse period at the usual power voltage. The short pulse period Tosc3 makes the counter (not shown) increase the refresh operation per unit time, and the total amount of current consumption per unit time is increased.

SUMMARY OF THE INVENTION

It is therefore an important object of the present invention to provide a ring oscillator, which keeps the pulse period of an output pulse signal constant regardless of a power voltage.

In accordance with one aspect of the present invention, there is provided a ring oscillator for producing an output pulse signal comprising a plurality of logic gates equal in odd number and forming a loop for producing an output pulse signal, a source of power voltages connected to certain logic gates selected from the plurality of logic gates and supplying a power voltage to the certain logic gates so that each of the certain logic gates accelerates a logical operation when the power voltage is increased in magnitude, and a current controller connected between the sources of power voltages and remaining logic gates of the plurality of logic gates and controlling each of the remaining logic gates in such a manner as to decelerate the logical operation when the power voltage is increased in magnitude.

BRIEF DESCRIPTION OF THE DRAWINGS

The features and advantages of the ring oscillator will be more clearly understood from the following description taken in conjunction with the accompanying drawings in which:

FIG. 1 is a circuit diagram showing the prior art ring oscillator;

FIG. 2 is a graph showing the output pulse signal generated by the prior art ring oscillator;

DESCRIPTION OF THE PREFERRED EMBODIMENT

Figure 10:
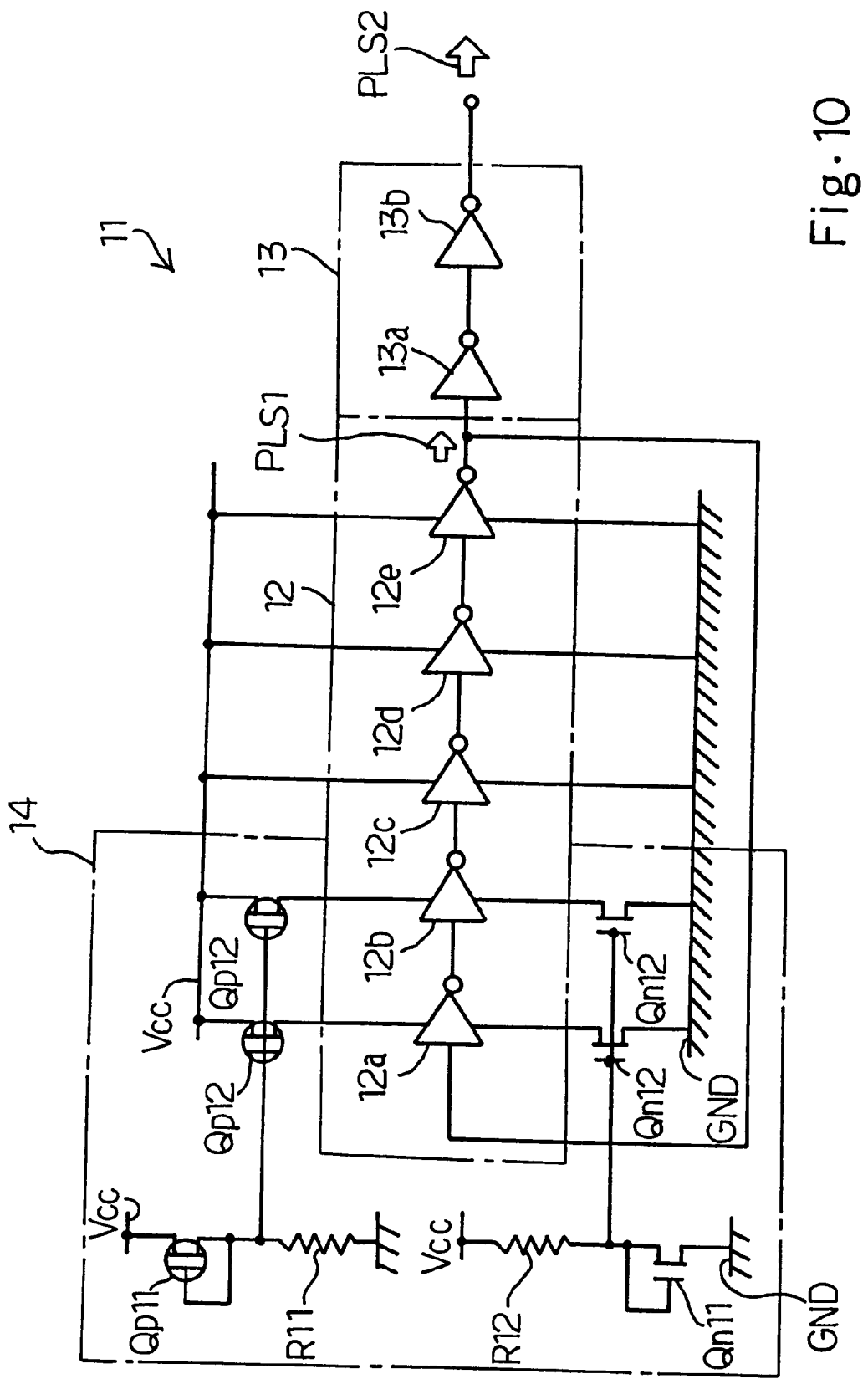
FIG. 10 is a circuit diagram showing the configuration of a ring oscillator according to the present invention.

Referring to FIG. 10 of the drawings, a ring counter 11 largely comprises a loop 12, an output circuit 13 and a current controller 14. Odd inverters 12a/ 12b/ 12c/ 12d/ 12e are connected in such a manner as to form the loop 12, and a pulse signal PLS1 is supplied from the last inverter 12e to the output circuit 13 and the first inverter 12a. The output circuit 13 includes two inverters 13a/ 13b, and the pulse signal PLS1 is supplied from the last inverter 12e to the first inverter 13a. The output circuit 13 produces an output pulse signal PLS2 from the pulse signal PLS1.

The current controller 14 includes a series combination of a p-channel enhancement type load transistor Qp11 and a resistor R11 connected between a power voltage line Vcc and a ground line GND and p-channel enhancement type current controlling transistors Qp12 connected in parallel between the power voltage line Vcc and the inverters 12a/ 12b. The gate electrode of the p-channel enhancement type load transistor Qp11 is connected to the drain node thereof, and is further connected to the gate electrodes of the p-channel enhancement type current controlling transistors Qp12.

The current controller 14 further includes a series combination of a resistor R12 and an n-channel enhancement type load transistor Qn11 connected between the power supply line Vcc and the ground line GND and n-channel enhancement type current controlling transistors Qn12 connected between the inverters 12a/ 12b and the ground line GND. The gate electrode of the n-channel enhancement type load transistor Qn11 is connected to the drain node thereof, and is further connected to the gate electrodes of the n-channel enhancement type current controlling transistors Qn12. Thus, the current controller 14 controls only the inverters 12a/ 12b, and the other inverters 12c/ 12d/ 12e are directly connected between the power supply line Vcc and the ground line GND.

Figure 9:
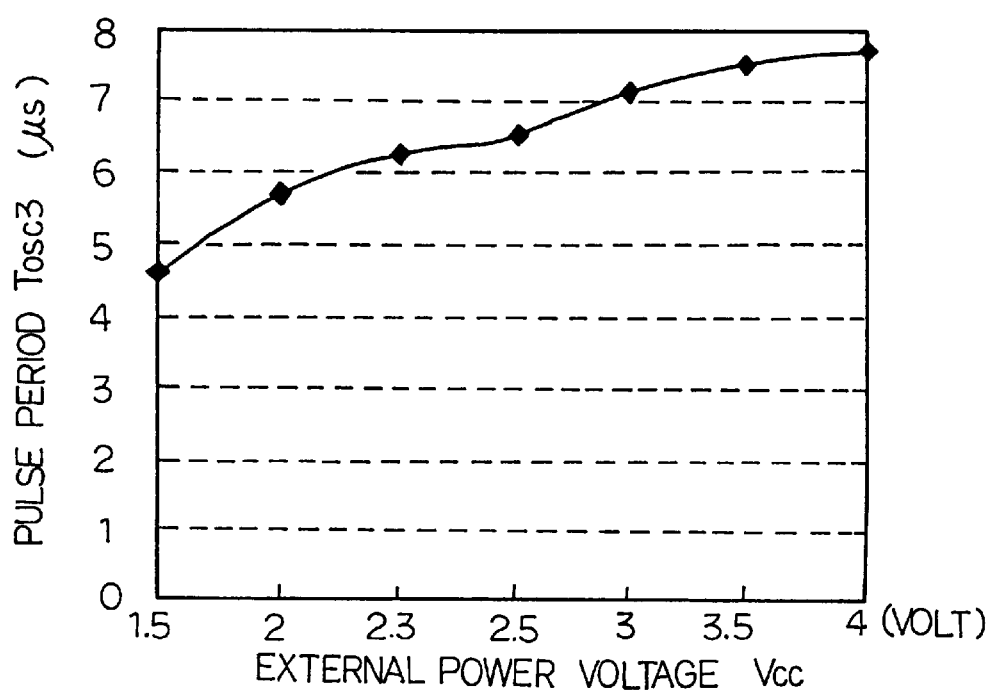
FIG. 9 is a graph snowing the relation between the pulse period of the output pulse signal and the magnitude of the external power voltage.

The p-channel enhancement type load transistor Qp11 controls the amount of current supplied to all the inverters 12a–12b, and n-channel enhancement type load transistor Qn11 controls the amount of current discharged from all the inverters 12a–12b. The current controller 14 behaves as similar to the current controller 7, and the inverters 12a/ 12b exhibit the characteristics shown in FIG. 9. On the other hand, the other inverters 12c/ 12d/ 12e are directly affected by the potential variation of the power supply line Vcc, and exhibits the characteristics shown in FIG. 3.

Figure 11:
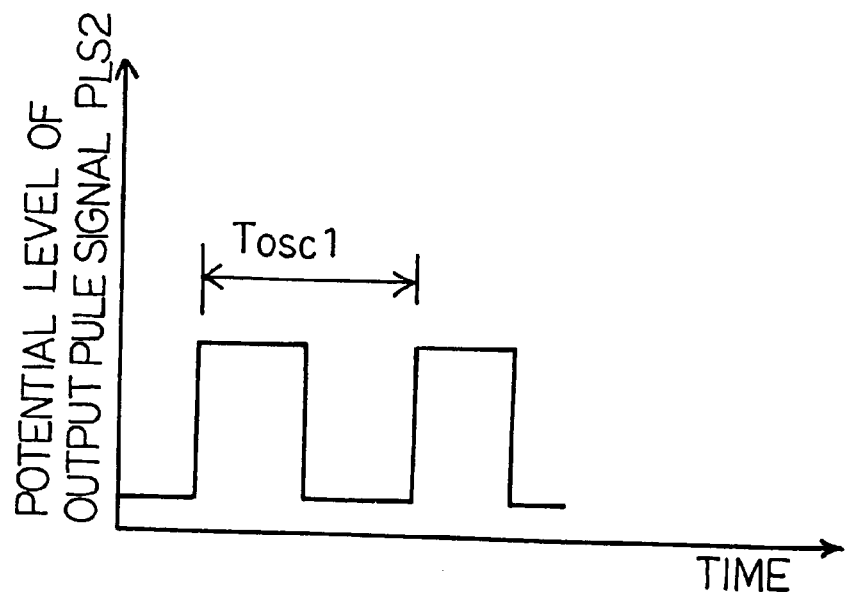
FIG. 11 is a graph showing the output pulse generated by the ring oscillator shown in FIG. 10.

When the inverters 12a to 12e are directly and indirectly energized by the power supply line Vcc, the pulse signal PLS1 periodically raises the potential level, and causes the output circuit 13 to output the output pulse signal PLS2. The output pulse signal PLS2 has the pulse interval Tosc1 as shown in FIG. 11.

Figure 3:
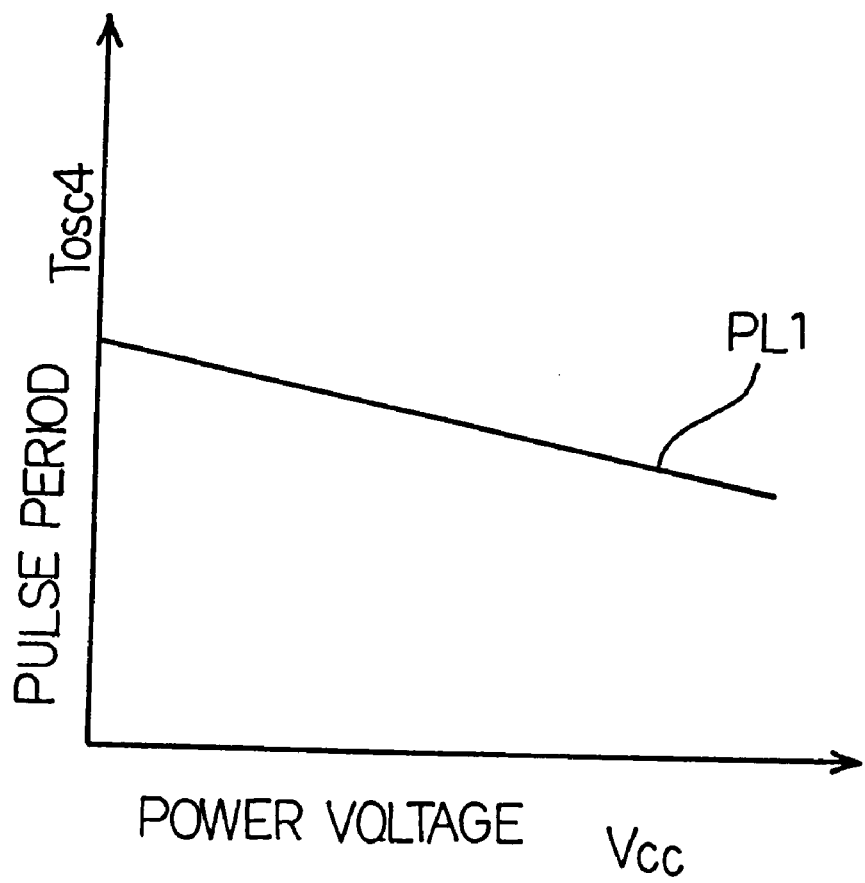
FIG. 3 is a graph showing the relation between the pulse period and the magnitude of power voltage.
Figures 4, 5:
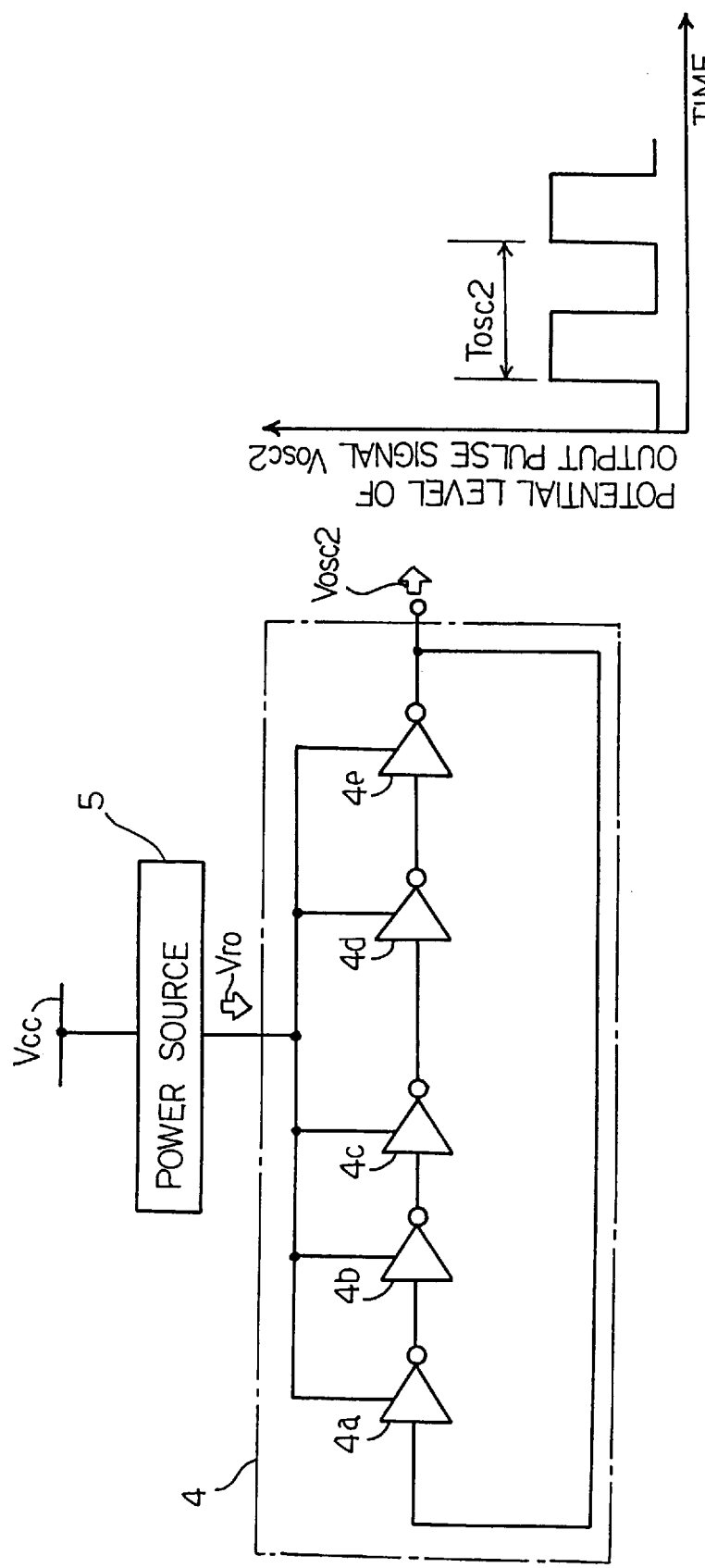
FIG. 4 is a circuit diagram showing the prior art oscillator disclosed in Japanese Patent Publication of Unexamined Application No. 4-259986.
FIG. 5 is a graph showing the waveform of the output pulse signal generated by the prior art ring oscillator shown in FIG. 4.
Figure 6:
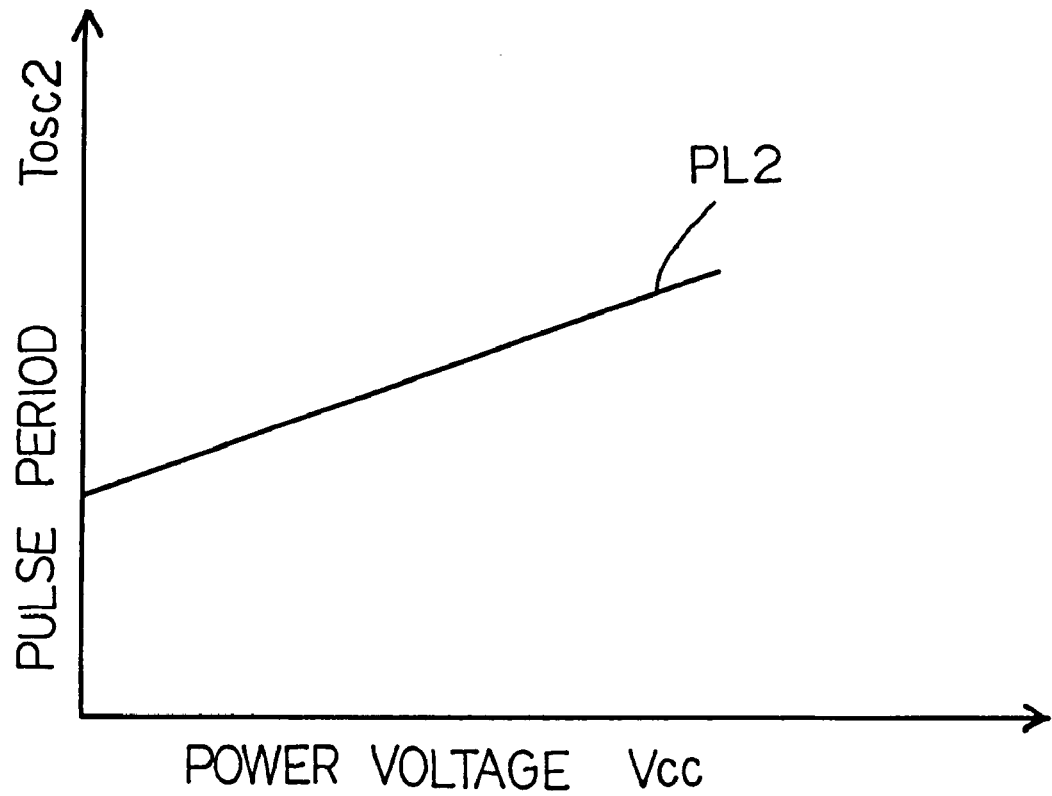
FIG. 6 is a graph showing the relation between the pulse period and the magnitude of the power voltage.
Figure 7:
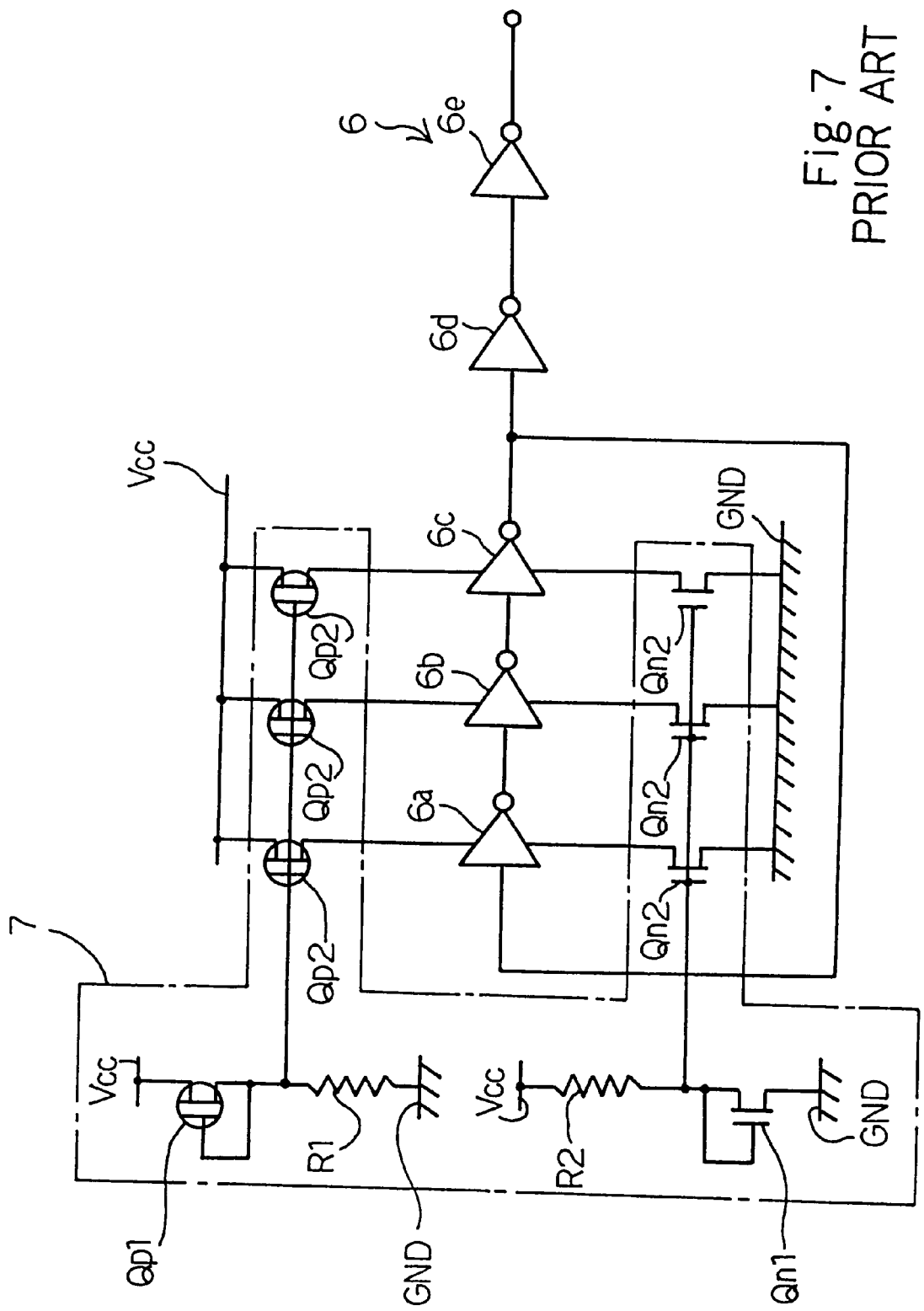
FIG. 7 is a circuit diagram showing the prior art ring oscillator.
Figure 8:
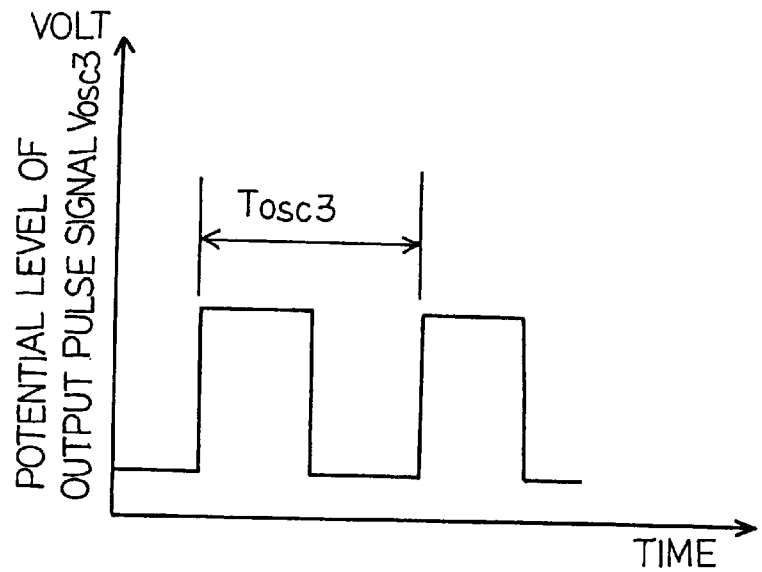
FIG. 8 is a graph showing the output pulse signal generated by the prior art ring oscillator shown in FIG. 7.
Figure 12:
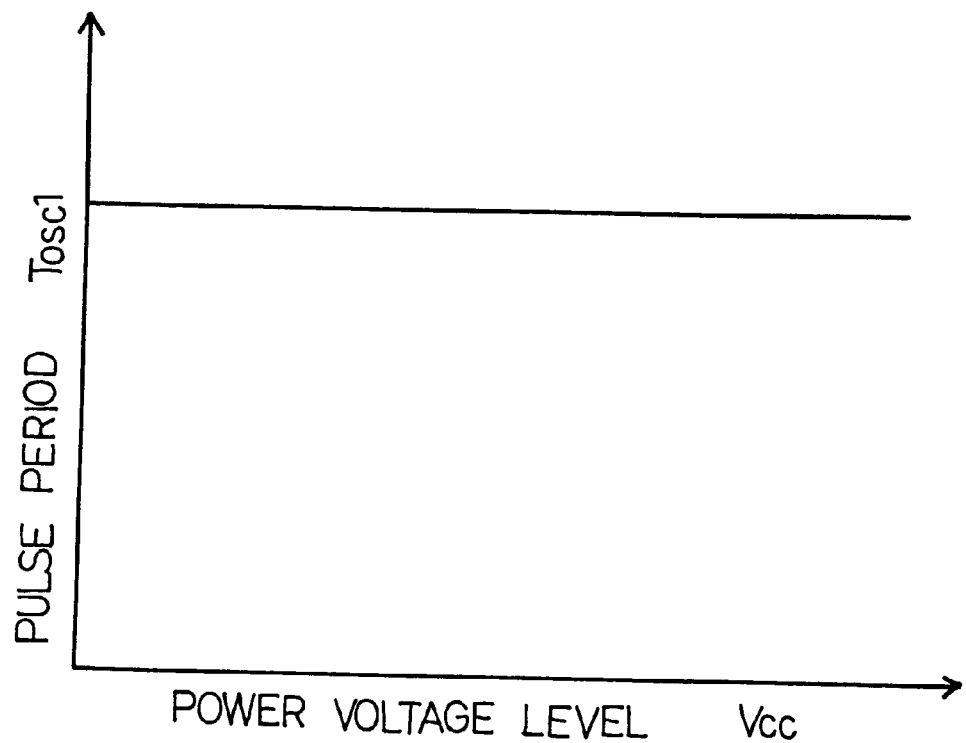
FIG. 12 is a graph showing relation between the pulse period of an output pulse signal and the magnitude of a power voltage.

The inverters 12a/ 12b cause the output circuit 13 to vary the pulse period Tosc1 proportionally to the magnitude of the power voltage Vcc (see FIG. 9), and the inverters 12c/ 12d/ 12e cause the output circuit 13 to vary the pulse period Tosc1 inversely proportional to the power voltage Vcc (see FIG. 3). The increment introduced by the inverters 12a/ 12b is canceled with the decrement introduced by the inverters 12c/ 12d/ 12e, and the pulse period Tosc1 is substantially constant over the magnitude of power voltage Vcc as shown in FIG. 12.

As will be appreciated from the foregoing description, the ring oscillator according to the present invention cancels the proportional tendency with the inversely proportional tendency, and achieves the constant pulse period over the magnitude of the power voltage.

Application to Dynamic Random Access Memory Device

Figure 13:
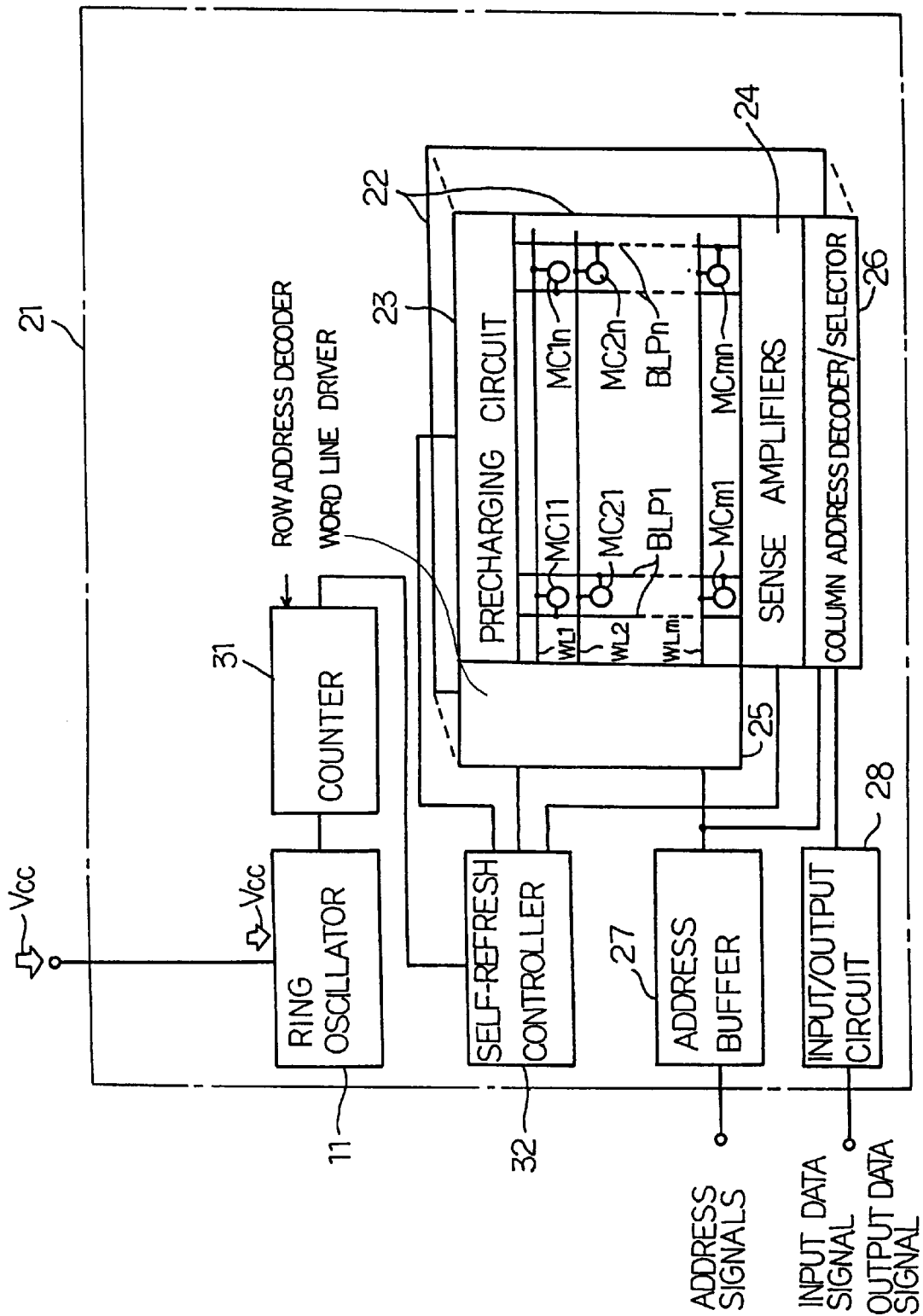
FIG. 13 is a block diagram showing essential parts of a semiconductor dynamic random access memory device.

FIG. 13 illustrates a semiconductor dynamic random access memory device embodying the present invention. The semiconductor dynamic random access memory device is fabricated on a single semiconductor chip 21, and comprises memory cell arrays 22. Each of the memory cell arrays 22 includes dynamic memory cells MC11-MC1n, MC21-MC2n . . . and MCm1-MCmn arranged in matrix, and word lines WL1 -WLm and bit line pairs BLP1 -BLPn are selectively connected to the dynamic cells M11 to Mmn. The dynamic cell is implemented by a series of n-channel enhancement type access transistor and a storage capacitor.

The semiconductor dynamic random access memory device further comprises a precharging circuit 23, sense amplifiers 24, a row address decoder/word line driver 25, a column address decoder/selector 26, an address buffer 27 and an input/output circuit 28. The precharging circuit 23 charges the bit line pairs BLP1 to BLPn to a precharge level, and equalizes the bit lines of each pair. Row address bits are supplied from the address buffer 27 to the row address decoder/word line driver 25, and the row address decoder/word line driver 25 energizes one of the word lines to active level. Then, the dynamic cells coupled to the selected word line are electrically connected to the bit line pairs BLP1 to BLPn, respectively, and produce potential differences on the bit line pairs BLP1 to BLPn, respectively.

The sense amplifiers 24 increases the magnitude of the potential differences on the bit line pairs BLP1 to BLPn, and the potential differences are representative of read-out data bits. Column address bits are supplied from the address buffer 27 to the column address decoder/selector 26, and the column address decoder/selector 26 selectively transfers the read-out data bits to the input/output circuit 28, and the input/output circuit 28 produces an output data signal from the read-out data bit. The behavior of the semiconductor dynamic random access memory device is well known to a person skilled in the art.

The semiconductor dynamic random access memory device carries out a self-refresh under a voltage lower than an external power voltage Vcc. The semiconductor dynamic random access memory device further comprises the ring oscillator 11, a counter 31 and a self-refresh controller 32. The external power voltage Vcc is decreased to 2 volts, and is directly supplied from a power supply pin to the ring oscillator. Thus, the ring oscillator 11 is powered with the external power voltage Vcc of 2 volts.

The output pulse signal PLS2 is supplied from the ring oscillator 11 to the counter 31, and the counter 31 increments the value at every output pulse. When the access to the memory cell arrays 22 is completed, the counter 31 is reset with an internal control signal (not shown), and starts to count the output pulses. When the counter 31 reaches a predetermined value, the counter 31 supplies an enable signal to the self-refresh controller 32, and the self-refresh controller 32 sequentially activates the precharging circuit 23, the row address decoder/word line driver 25 and the sense amplifier 24 so as to refresh data bits stored in the dynamic cells MC11 to MCmn.

As described hereinbefore, the ring oscillator 11 keeps the pulse period Tosc1 constant regardless of the power voltage level. As described hereinbefore, the ring oscillator 11 is powered with the external power voltage Vcc of 2 volts in the self-refreshing, the counter 31 supplies the enable signal to the self-refresh controller 32 at predetermined intervals, and the current consumption is surely reduced.

Although a particular embodiment of the present invention has been shown and described, it will be apparent to those skilled in the art that various changes and modifications may be made without departing from the spirit and scope of the present invention.

For example, the inverters may be replaced with NOR gates or NAND gates so as to be enabled with an external signal. The loop 12 may be formed by inverters equal to another odd number. The pulse signal PLS1 may be directly supplied to the counter.

What is claimed is:

1. A ring oscillator for producing a constant output pulse signal, comprising:

a plurality of logic gates equal in odd number, and forming a loop for producing an output pulse signal;

sources of power voltages connected to certain logic gates selected from said plurality of logic gates, and supplying a power voltage to said certain logic gates so that each of said certain logic gates accelerates a logical operation when said power voltage is increased in magnitude; and a current controller connected between said sources of power Va voltages and remaining logic gates of said plurality of logic gates, and controlling each of said remaining logic gates in such a manner as to decelerate the logical operation when said power voltage is increased in magnitude, wherein operations of said certain logic gates supplied with said power voltage and operations of said logic gates controlled by said current controller offset each other to provide said constant output pulse signal.

2. The ring oscillator as set forth in claim 1, in which each of said plurality of logic gates is implemented by an inverter.

3. The ring oscillator as set forth in claim 1, in which said current controller includes
- a series combination of a first load transistor, a first node and a first resistive element connected between said sources of power voltage,
- first current controlling transistors connected between one of said sources of power voltages and first current nodes of said certain logic gates and having respective control nodes connected to said first node,
- a series combination of a second resistive element, a second node and a second load transistor connected between said sources of power voltages, and
- second current controlling transistors connected between another of said sources of power voltages and second current nodes of said certain logic gates and having respective control nodes connected to said second node.

4. The ring oscillator as set forth in claim 3, in which said first load transistor and said first current controlling transistors are operative in a p-channel enhancement mode, and said second load transistor and said second current controlling transistors are operative in an n-channel enhancement mode.

5. The ring oscillator as set forth in claim 1, further comprising an output circuit connected to said plurality of logic gates for producing a secondary output pulse signal from said output pulse signal.

6. The ring oscillator as set forth in claim 1, in which said output pulse signal is supplied to a counter forming a part of a self-refreshing system incorporated in a semiconductor dynamic random access memory device.

7. The ring oscillator as set forth in claim 6, in which said counter defines refresh intervals.

8. The ring oscillator as set forth in claim 6, in which said semiconductor dynamic random access memory device supplies a step-down power voltage to one of said sources of power voltages during a self-refreshing operation.

9. The ring oscillator of claim 1, wherein said plurality of logic gates is arranged in cascade form, each of said logic gates directly receiving an output from another of said logic gates.

10. The ring oscillator according to claim 9, wherein in which said current controller includes
- a series combination of first load transistor, a first node and a first resistive element connected between said sources of power voltage,
- first current controlling transistors connected between one of said sources of power voltages and first current nodes of said certain logic gates and having respective control nodes connected to said first node,
- a series combination of a second resistive element, a second node and a second load transistor connected between said sources of power voltages, and
- second current controlling transistors connected between another of said sources of power voltages and second current nodes of said certain logic gates and having respective control nodes connected to said second node.

11. The ring oscillator of claim 9, wherein two of the plurality of inverters are controlled by said current controller.

* * * * *